(12) United States Patent
Schupp et al.

(10) Patent No.: US 10,666,252 B2
(45) Date of Patent: May 26, 2020

(54) CAPACITIVE SENSOR

(71) Applicant: Robert Bosch GmbH, Stuttgart (DE)

(72) Inventors: Dietrich Schupp, Weissach (DE);
Joachim Frangen, Heilbronn (DE);
Volker Eisenhardt, Rutesheim (DE);
Norbert Wenzel, Rutesheim (DE);
Volker Hartmann, Lorch (DE); Frank Gaesslein, Waiblingen (DE)

(73) Assignee: Robert Bosch GmbH, Stuttgart (DE)

( * ) Notice: Subject to any disclaimer, the term of this patent is extended or adjusted under 35 U.S.C. 154(b) by 324 days.

(21) Appl. No.: 15/509,022

(22) PCT Filed: Jul. 13, 2015

(86) PCT No.: PCT/EP2015/065927
§ 371 (c)(1),
(2) Date: Mar. 6, 2017

(87) PCT Pub. No.: WO2016/041653
PCT Pub. Date: Mar. 24, 2016

(65) Prior Publication Data
US 2017/0257094 A1     Sep. 7, 2017

(30) Foreign Application Priority Data
Sep. 16, 2014   (DE) .................. 10 2014 218 535

(51) Int. Cl.
*H03K 17/955*   (2006.01)
*F16P 3/14*   (2006.01)
*G01V 3/08*   (2006.01)

(52) U.S. Cl.
CPC ............ *H03K 17/955* (2013.01); *F16P 3/148* (2013.01); *G01V 3/08* (2013.01); *G01V 3/088* (2013.01)

(58) Field of Classification Search
CPC .... G01R 15/16; G01R 27/26; G01R 27/2605; G01D 5/24; G01V 3/00; H03K 17/955; F16P 3/148
(Continued)

(56) References Cited

U.S. PATENT DOCUMENTS 5,610,528 A * 3/1997 Neely .................. A61B 5/1071
                                                    324/660
7,359,286 B2 * 4/2008 Stuart Savoia ........ H04R 19/00
                                                    367/181

(Continued)

FOREIGN PATENT DOCUMENTS

DE     102009029021 A1 *   3/2011  .............. G01L 1/142
DE     102009029021 A1     3/2011
(Continued)

OTHER PUBLICATIONS

LionPrecision. Capacitive Sensors. http://www.lionprecision.com/capacitive-sensors/ Apr. 2007 (Year: 2007).*
(Continued)

*Primary Examiner* — Patrick Assouad
*Assistant Examiner* — Sean Curtis
(74) *Attorney, Agent, or Firm* — Norton Rose Fulbright US LLP; Gerard Messina

(57) ABSTRACT

A capacitive sensor for detecting at a surface that an object is approaching which is designed to be flexurally rigid and/or torsionally rigid. The capacitive sensor includes a circuit carrier and/or a spacer element and/or a carrier. In this case, the circuit carrier is designed to be flexurally rigid and/or torsionally rigid and/or the spacer element is designed to be flexurally rigid and/or torsionally rigid and/or the carrier is designed to be flexurally rigid and/or torsionally rigid. The circuit carrier is in the form of a circuit board and is used for making electrical contact with the electrically
(Continued)

conductive surfaces of the capacitive sensor. The spacer element is situated between the electrically conductive surfaces and the circuit carrier. The carrier is designed for connecting the capacitive sensor to a machine part, in particular to a machine part of an industrial robot.

17 Claims, 5 Drawing Sheets

(58) Field of Classification Search
USPC .................................................. 324/658, 686
See application file for complete search history.

(56) References Cited

U.S. PATENT DOCUMENTS

| | | | | |
|---|---|---|---|---|
| 7,578,195 | B2* | 8/2009 | DeAngelis | G01L 1/146 324/687 |
| 7,705,611 | B2* | 4/2010 | Ogata | G01D 5/2417 324/658 |
| 7,894,643 | B2* | 2/2011 | Setlak | G06K 9/00053 324/686 |
| 8,232,810 | B2* | 7/2012 | Reynolds | G06F 3/044 324/661 |
| 8,653,837 | B2* | 2/2014 | Frangen | G01D 5/2405 324/662 |
| 9,075,095 | B2* | 7/2015 | Kallassi | G01L 1/146 |
| 9,135,495 | B1* | 9/2015 | Pope | G06F 3/044 |
| 9,366,708 | B2* | 6/2016 | White | G06F 3/0414 |
| 9,371,032 | B2* | 6/2016 | Veerasamy | B32B 17/10036 |
| 9,513,321 | B2* | 12/2016 | Frangen | B25J 13/086 |
| 9,559,515 | B2* | 1/2017 | Frangen | H02H 5/12 |
| 9,815,343 | B1* | 11/2017 | Laflamme | B60C 23/064 |
| 9,958,532 | B2* | 5/2018 | Burger | G06F 3/044 |
| 2006/0097734 | A1* | 5/2006 | Roziere | A61B 6/102 324/662 |
| 2007/0248799 | A1* | 10/2007 | DeAngelis | G01L 1/146 428/209 |
| 2008/0127739 | A1* | 6/2008 | DeAngelis | G01L 1/146 73/718 |
| 2008/0211519 | A1* | 9/2008 | Kurumado | G01D 5/24 324/688 |
| 2010/0097078 | A1* | 4/2010 | Philipp | G06F 3/0418 324/684 |
| 2010/0289503 | A1* | 11/2010 | Reynolds | G06F 3/044 324/658 |
| 2011/0050256 | A1* | 3/2011 | Frangen | G01D 5/2405 324/681 |
| 2011/0148435 | A1* | 6/2011 | Schwartz | G06F 3/0416 324/658 |
| 2011/0184558 | A1* | 7/2011 | Jacob | B25J 9/1676 700/259 |
| 2013/0019618 | A1* | 1/2013 | Veerasamy | B32B 17/10036 62/85 |
| 2013/0024169 | A1* | 1/2013 | Veerasamy | B32B 17/10036 703/2 |
| 2013/0075381 | A1* | 3/2013 | Wittkowski | B60N 2/002 219/201 |
| 2013/0093500 | A1* | 4/2013 | Bruwer | H03K 17/955 327/517 |
| 2013/0100053 | A1* | 4/2013 | Kang | G06F 3/044 345/173 |
| 2013/0106702 | A1* | 5/2013 | Chen | G06F 3/0416 345/168 |
| 2013/0342224 | A1* | 12/2013 | Frangen | B25J 13/086 324/679 |
| 2014/0001888 | A1* | 1/2014 | Frangen | H02H 5/12 307/326 |
| 2014/0218057 | A1* | 8/2014 | White | G06F 3/0414 324/686 |
| 2014/0238152 | A1* | 8/2014 | Kallassi | G06F 3/044 73/862.626 |
| 2015/0242675 | A1* | 8/2015 | Pope | G06F 3/044 382/124 |
| 2017/0257094 | A1* | 9/2017 | Schupp | F16P 3/148 |
| 2018/0088633 | A1* | 3/2018 | Whitman | G06F 3/0448 |

FOREIGN PATENT DOCUMENTS

| | | | | |
|---|---|---|---|---|
| DE | 102010064328 | A1 * | 7/2012 | ............ G01D 5/24 |
| DE | 102010064328 | A1 | 7/2012 | |
| DE | 102014218535 | A1 * | 3/2016 | ............ G01V 3/088 |
| EP | 3194831 | A1 * | 7/2017 | ............ F16P 3/148 |
| JP | S63238502 | A | 10/1988 | |
| JP | 2008004465 | A | 1/2008 | |
| JP | 2010237144 | A | 10/2010 | |
| JP | 2010257181 | A | 11/2010 | |
| JP | 2011248629 | A | 12/2011 | |
| WO | WO-2016041653 | A1 * | 3/2016 | ............ G01V 3/08 |

OTHER PUBLICATIONS

International Search Report dated Oct. 14, 2015, of the corresponding International Application PCT/EP2015/065927 filed Jul. 13, 2015.

* cited by examiner

CAPACITIVE SENSOR

BACKGROUND INFORMATION

The present invention relates to a capacitive sensor for detecting at a surface that an object is approaching.

German Patent Application Nos. DE 10 2009 029 021 A1 and DE 10 2010 064 328 A1 describe a sensor system and an evaluation method for surroundings monitoring at a mechanical component including at least one capacitive sensor element, the capacitive sensor element being mountable on the surface of machines or machine parts. The capacitive sensor element is made up of a layered structure of flexible electrically conductive and electrically insulating layers. In this case, multiple adjacently situated, capacitive sensor elements form a sensor skin, which may be pulled over a machine part to be protected, in the manner of a jacket.

SUMMARY

An example capacitive sensor according to the present invention has a stable configuration. This has the advantage that large and rigid capacitive sensors are thereby able to be manufactured, which are mountable quickly and reliably on machine parts, in particular on a mechatronic system or a handling device, in particular on a linear axis, on a robot, on a transport system, or on a gripper of a robot. Furthermore, the capacitive sensor according to the present invention has the advantage that once installed, capacitive sensors are able to be easily exchanged. In addition, simple module tests in the disassembled state are possible.

Rigidity is a variable which indicates how well a body may resist a deformation caused by an external influence. Depending on the type of external influence, a distinction is made, inter alia, between flexural rigidity and torsional rigidity. Flexural rigidity is defined in this case as the product of the geometrical moment of inertia $I_F$ and the elasticity modulus E. Flexural rigidity therefore depends both on the cross-sectional shape (shape of the component) and on the material itself (elasticity modulus). Torsional rigidity, however, is defined as the product of the torsional moment of inertia $I_T$ and the material shear modulus G. Therefore, torsional rigidity is also component- and material-dependent. Rigidity is alternatively defined by way of the mean elasticity modulus and the thickness. Given a total thickness of the flexurally rigid and/or torsionally rigid material of 2 mm, polyethylene having an elasticity modulus of 200 MPa already has flexural rigidity or torsional rigidity, while polycarbonate having an elasticity modulus of 2400 MPa is likewise flexurally rigid and/or torsionally rigid. Steel having an elasticity modulus of 210000 MPa is likewise flexurally rigid and/or torsionally rigid when the steel has a thickness of 2 mm. The capacitive sensor is flexurally rigid and/or torsionally rigid when the product of thickness and elasticity modulus of at least one element or a composite of at least two individual elements, in particular the circuit carrier and/or the spacer element and/or the carrier and/or the encapsulated capacitive sensor, is greater than 200 MPa mm, preferably greater than 1800 MPa mm, in particular greater than 4000 MPa mm.

The capacitive sensor includes at least two electrically conductive surfaces, which adjoin one another and are insulated with respect to one another and form an electrical capacitor in such a way that the value of the capacitance changes when an object is approaching. After the charging of the capacitor, an electrical field forms, in the form of electrical field lines between the electrically conductive surfaces in the space between the electrically conductive surfaces. When an object is approaching, this electrical field is disturbed and the spatial distribution of the electrical field lines changes, so that, in the end, the value of the capacitance measurably changes when an object is approaching. This has the advantage that objects are already detected when they are approaching, without a need for the sensor to be contacted. Therefore, approaching objects are detected early.

It is particularly advantageous that the circuit carrier, in particular the circuit board, of the capacitive sensor is itself already designed to be flexurally rigid and/or torsionally rigid, so that the entire capacitive sensor is flexurally rigid and/or torsionally rigid. The flexurally rigid and/or torsionally rigid design of the circuit carrier has the advantage that this contributes to a cost-effective capacitive sensor, since the circuit carrier is a mass-produced product and, therefore, is a cost-effective component.

It is advantageous that the spacer element of the capacitive sensor is itself already designed to be flexurally rigid and/or torsionally rigid, so that the entire capacitive sensor is flexurally rigid and/or torsionally rigid. The flexurally rigid and/or torsionally rigid design of the spacer element between the shielding electrode and the electrically conductive surfaces of the capacitors has the advantage that, as a result, the flexural rigidity and/or torsional rigidity is/are able to be cost-effectively manufactured. This is due to the fact that the remaining requirements of the spacer element are low and, therefore, a cost-effective material may be used. The use of a thermoplastic plastic or a duroplastic plastic is particularly advantageous. The spacer element preferably has a dielectric constant of less than 1.5, preferably less than 1.1, in particular less than 1.01. The spacer element is preferably made up of foamed plastic and/or of webs and/or of foam rubber.

The specific embodiment is particularly advantageous which is a non-flexurally rigid and/or torsionally rigid circuit board including a spacer element which itself is likewise non-flexurally rigid and/or torsionally rigid, for example, a foam rubber, the composite made up of the circuit board and the spacer element being flexurally rigid and/or torsionally rigid due to the connection of this non-flexurally rigid and/or torsionally rigid circuit board to the non-flexurally rigid and/or torsionally rigid spacer element, for example by bonding.

It is particularly advantageous if the electrically conductive surfaces make contact with the circuit carrier via electrically conductive connections through the spacer element, since this contributes to a compact design, since no separate electrical connections are necessary.

It is advantageous if the carrier of the capacitive sensor is itself already designed to be flexurally rigid and/or torsionally rigid, so that the entire capacitive sensor is flexurally rigid and/or torsionally rigid. Since established manufacturing methods may be used for manufacturing the carrier, this contributes to the ability of the capacitive sensor to be cost-effectively manufactured.

It is particularly advantageous if the capacitive sensor is designed to be flexurally rigid and/or torsionally rigid by encapsulating the capacitive sensor and/or filling the capacitive sensor with foam. The encapsulation or the foam-filling additionally contributes to the capacitive sensor being particularly robust with respect to environmental influences, such as moisture.

It is further advantageous if at least two of the electrically conductive surfaces are slanted with respect to one another at an angle between 0° and 135°, preferably at an angle between 45° and 90°. This contributes to the ability to also monitor corners of machine parts.

It is particularly advantageous if the capacitive sensor includes at least three electrically conductive surfaces, preferably four electrically conductive surfaces, which are interconnected in such a way that the electrically conductive surfaces form at least two electrical capacitors, the electrically conductive surfaces being situated in such a way that detection areas, which are formed by electrical field lines, of the two electrical capacitors at least partially overlap. This allows for the redundant monitoring of the same spatial area and, therefore, the redundant detection of the approach by an object with the aid of two independent measuring systems, so that the approach by an object may still be reliably detected in the event of failure of one measuring system.

In a particularly advantageous way, the capacitive sensor according to the present invention is used in robots, in particular industrial robots, since an operationally safe interaction between humans and a moving machine part of the robot in the same working space at the same time is possible as a result. This is made possible, on the one hand, by way of the capacitive sensor essentially covering the entire surface area of the movable machine parts of the robot and, on the other hand, by detecting an approach by an object very early without the need for a touching contact.

Further advantages result from the description below of exemplary embodiments with reference to the figures.

BRIEF DESCRIPTION OF THE DRAWINGS

Exemplary embodiments of the present invention are represented in the figures and are described in greater detail below with reference to multiple figures.

DETAILED DESCRIPTION OF EXAMPLE EMBODIMENTS

A capacitive sensor for detecting at a surface that an object is approaching is described below, the capacitive sensor being designed to be flexurally rigid and/or torsionally rigid. The capacitive sensor preferably includes a circuit carrier and/or a spacer element and/or a carrier. In this case, the circuit carrier is designed to be flexurally rigid and/or torsionally rigid and/or the spacer element is designed to be flexurally rigid and/or torsionally rigid and/or the carrier is designed to be flexurally rigid and/or torsionally rigid. The circuit carrier is preferably in the form of a circuit board and is used for making electrical contact with the electrically conductive surfaces of the capacitive sensor. The spacer element is situated between the electrically conductive surfaces and the circuit carrier. The carrier is designed for connecting the capacitive sensor to a machine part, in particular to a machine part of an industrial robot.

Figure 1:
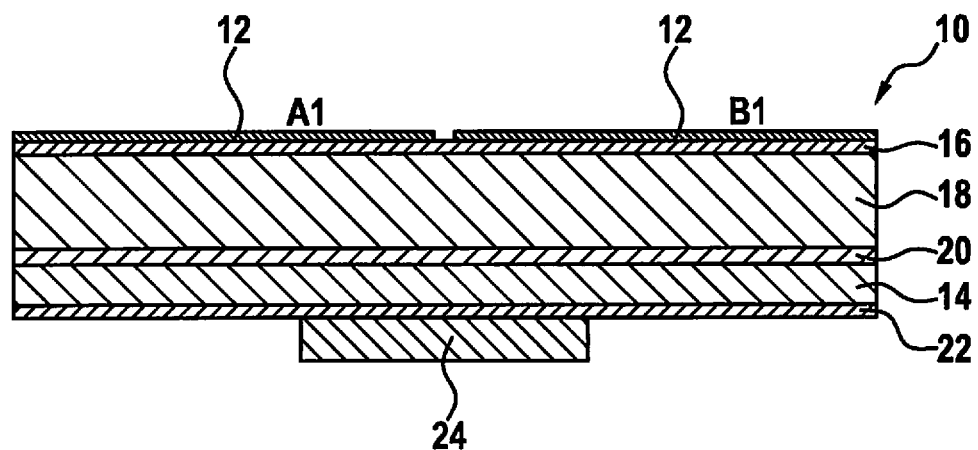
FIG. 1 shows the configuration of a sensor element of a capacitive sensor in one first exemplary embodiment.

FIG. 1 shows the configuration of a sensor element 10 of a capacitive sensor in one first exemplary embodiment. Sensor element 10 is made up of a layered structure including a circuit carrier 14. In this exemplary embodiment, the circuit carrier 14 is designed as a flexurally rigid and torsionally rigid circuit board. In one variant of this exemplary embodiment, circuit carrier 14 is designed to be flexible, as a foil. The thickness of the circuit carrier is between 30 μm, as a foil, and one to several millimeters, preferably 2 mm, as a flexurally rigid and torsionally rigid circuit board. The flexurally rigid and torsionally rigid circuit board preferably has a thickness of 500 μm. In this exemplary embodiment, strip conductors 22 are fixedly situated on the underside of circuit carrier 14, strip conductors 22 electrically connecting electrically conductive surfaces 12, which are located on the top side of sensor element 10, to electrical components (not shown) of evaluation unit 24. An electrically conductive shielding electrode 20 is situated on the top side of circuit carrier 14. Shielding electrode 20 faces electrically conductive surfaces 12. Shielding electrode 20 is used for the electromagnetic shielding of evaluation unit 24 situated under circuit carrier 14. A spacer element 18 is situated on the top of shielding electrode 20. In this exemplary embodiment, spacer element 18 is made up of a non-conductive, planar material (plate material) which has a low dielectric constant. Spacer element 18 is preferably made up of foamed organic material and/or foamed inorganic material. In this exemplary embodiment, spacer element 18 is designed to be flexible. In one variant of this exemplary embodiment, the spacer element is designed to be flexurally rigid and/or torsionally rigid. Spacer element 18 ensures the predefined distance between electrically conductive surfaces 12 and shielding electrode 20. A further circuit carrier 16 is situated on the top of spacer element 18. In this exemplary embodiment, further circuit carrier 16 is designed as a circuit board or as a foil. Electrically conductive surfaces 12, which are marked as A1 and B1, are installed on further circuit carrier 16. Electrically conductive surfaces 12 are made up of conductive material, in particular of copper. In one variant of this exemplary embodiment, electrically conductive surfaces 12 are designed as solid surfaces made up of conductive material, in particular copper, without the use of further circuit carrier 16. In this case, electrically conductive surfaces 12 are installed directly on the top side of spacer element 18. The two electrically conductive surfaces 12 labeled as A1 and B1 form an electrical capacitor, an electrical field forming between the two electrically conductive surfaces 12 after the electrical charging of the capacitor. If an object now penetrates the electrical field, the capacitance measurably changes, so that the approach by an object is detected. In this exemplary embodiment, sensor element 10 includes two further electrically conductive surfaces 12 (not shown) which are labeled with A2 and B2. In this case, the four electrically conductive surfaces 12 are situated in such a way that detection areas, which are formed by electrical field lines, of the two electrical capacitors at least partially overlap. Sensor element 10 is therefore designed to be redundant, having two channels.

Figure 2:
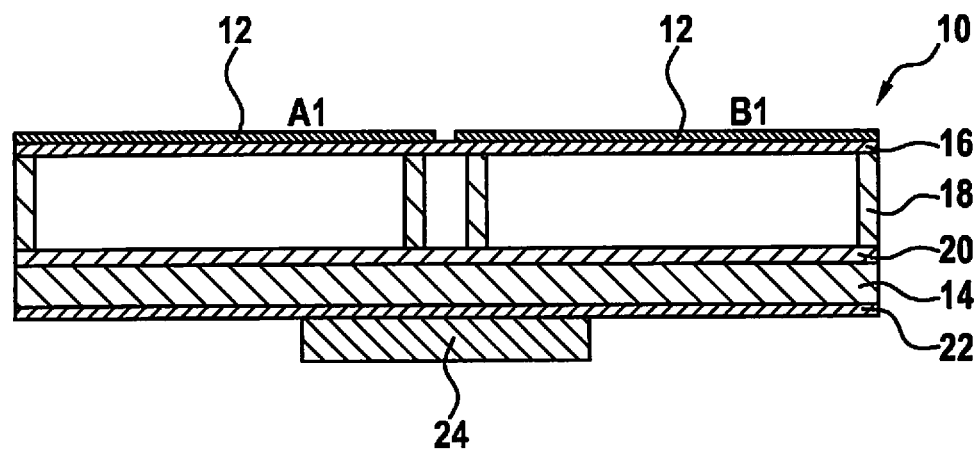
FIG. 2 shows the configuration of a sensor element of a capacitive sensor in one second exemplary embodiment.

FIG. 2 shows the configuration of a sensor element 10 of a capacitive sensor in one second exemplary embodiment. The second exemplary embodiment is identical to the first exemplary embodiment also in terms of the variants described for the first exemplary embodiment. The only difference is that spacer element 18 has a different design. Sensor element 10 of the second exemplary embodiment is likewise made up of two electrically conductive surfaces 12 which are labeled with A1 and B1 and form an electrical capacitor. Electrically conductive surfaces 12 are connected to spacer element 18 either via a further circuit carrier 16 or directly. Sensor element 10 further includes a circuit carrier 14 including strip conductors 22, an evaluation unit 24, and a shielding electrode 20. In this second exemplary embodiment, spacer element 18 is made up of a grid of non-conductive material, so that the grid has no interfering effect on the active principle of the capacitive sensor. In this second exemplary embodiment, spacer element 18 is likewise designed to be flexible. In one variant of this second exemplary embodiment, the spacer element is designed to be flexurally rigid and/or torsionally rigid. The mode of operation of sensor element 10 in the second exemplary embodiment is identical to the mode of operation of sensor element 10 in the first exemplary embodiment. In this second exemplary embodiment as well, sensor element 10 includes two further electrically conductive surfaces (not shown) which are labeled with A2 and B2. In this case, the four electrically conductive surfaces 12 are situated in such a way that detection areas, which are formed by electrical field lines, of the two electrical capacitors at least partially overlap, electrically conductive surfaces 12 labeled with A1 and B1, and those labeled with A2 and B2 each forming a capacitor and, therefore, a detection area. Sensor element 10 in the second exemplary embodiment is therefore likewise designed to be redundant, having two channels, since the spatial areas detected by the capacitors overlap.

Figure 3:
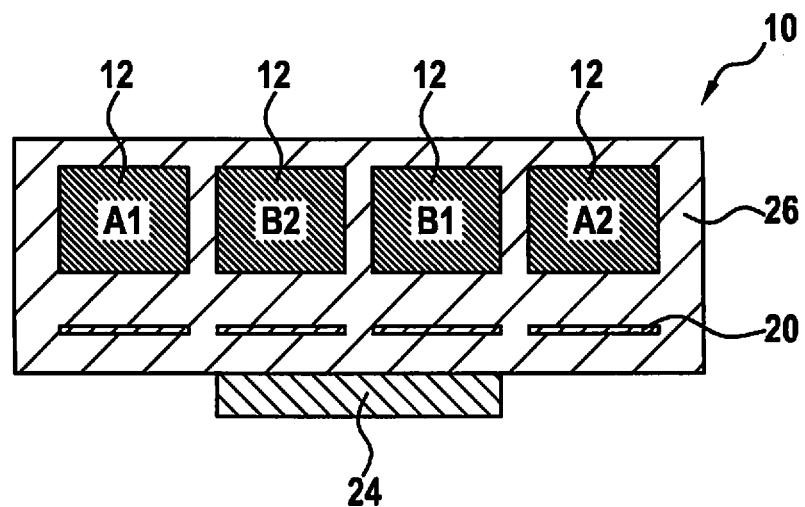
FIG. 3 shows the configuration of a sensor element of a capacitive sensor in one third exemplary embodiment.

FIG. 3 shows the configuration of a sensor element 10 of a capacitive sensor in one third exemplary embodiment. The third exemplary embodiment is based on the first exemplary embodiment and the second exemplary embodiment and is identical thereto except for the use of an encapsulation material 26. In this third exemplary embodiment, the layered structure of the sensor, in particular the electrically conductive layers 12 and/or the circuit carrier and/or the further circuit carrier and/or the spacer element and/or the shielding electrodes 20 and/or the strip conductors on the circuit carrier, are/is rigidly encapsulated using a curing encapsulation material 26, so that the capacitive sensor is flexurally rigid and/or torsionally rigid due to the encapsulation material 26. In one variant, a gel is used as an alternative to the encapsulation material 26. Alternatively, in one further variant, a foam, in particular a curing foam, is used, so that the layered structure of the sensor is foamed-filled. In one variant of the third exemplary embodiment, the layered structure of the sensor, in particular the electrically conductive surfaces 12 and/or the circuit carrier and/or the further circuit carrier and/or the spacer element and/or shielding electrodes 20 and/or the strip conductors on the circuit carrier, are/is installed in a housing, alternatively or in addition to encapsulation material 26. Sensor element 10 of the third exemplary embodiment likewise includes four electrically conductive surfaces 12, which are labeled with A1, A2, B1 and B2, electrically conductive surfaces 12 labeled with A1 and B1, and those labeled with A2 and B2 each forming a capacitor and, therefore, a detection area. Shielding electrodes 20 are situated underneath these electrically conductive surfaces 12. Encapsulation material 26 is preferably made up of foam rubber and/or foamed plastic and/or polyurethane (PU) and/or polyethylene (PE) and/or polypropylene (PP).

Figure 4:
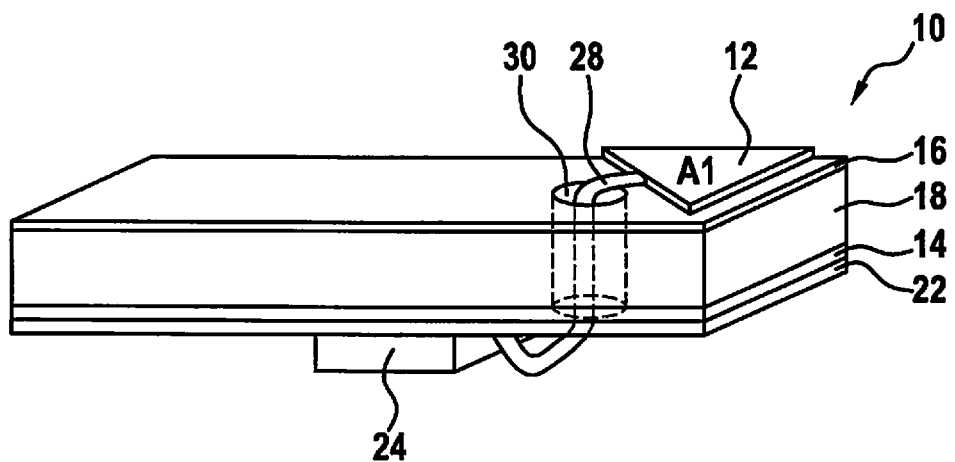
FIG. 4 shows a general layout drawing of a sensor element for illustrating the electrical contacting.

FIG. 4 shows a general layout of a sensor element 10 for illustrating the electrical contacting according to the first exemplary embodiment. Electrically conductive surface 12, which is shown by way of example labeled with A1 and used as an electrode, forms a capacitor together with a further electrically conductive surface (not shown), and is connected to the strip conductors 22 situated underneath circuit carrier 14 via a flexible, electrical conductor 28 through a hole 30 in spacer 18 and/or through a hole 30 in circuit carrier 14. Electrically conductive surface 12 is therefore electrically connected to evaluation unit 24. Alternatively or additionally, the electrical connection between the electrically conductive surface 12 and strip conductors 22 is established with the aid of rigid, electrically conductive elements, in particular with the aid of pins, and/or with the aid of conductive plastics, the conductive plastics preferably being applied using a jet process.

Figure 5:
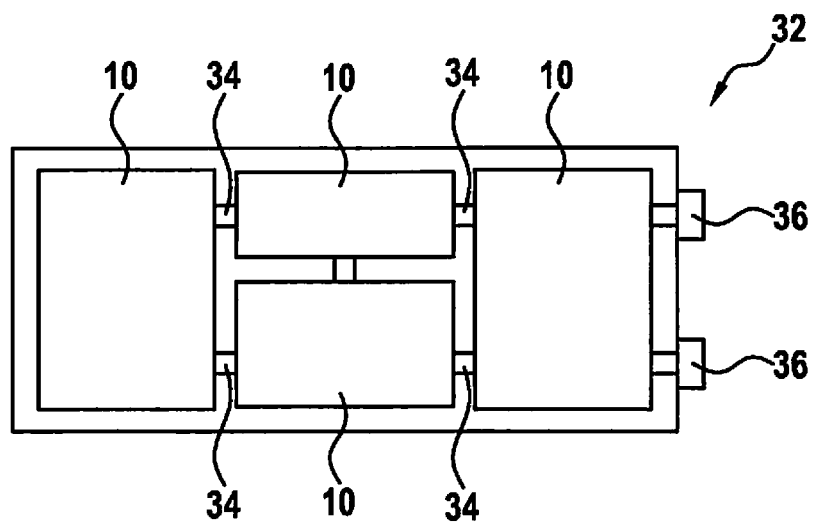
FIG. 5 shows the configuration of a sensor segment of a capacitive sensor.

FIG. 5 shows the configuration of a sensor segment 32 of a capacitive sensor made up of multiple sensor elements 10 which are connected electrically via electrical connections 34 and/or mechanically to one another to form a sensor segment 32. Sensor segment 32 includes at least one electrical plug connection 36, preferably two electrical plug connections 36, which make it possible to electrically and/or mechanically connect sensor segment 32 to further sensor segments 32.

Figure 6:
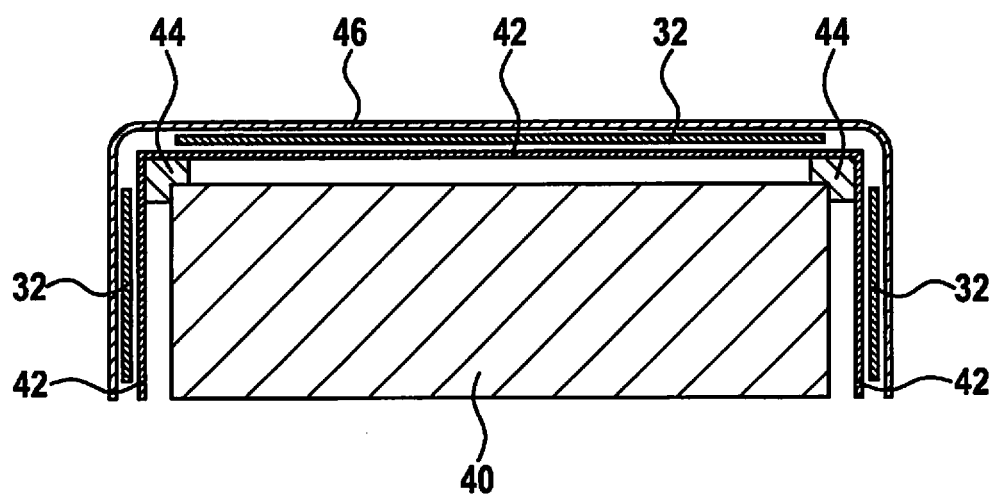
FIG. 6 shows one machine part including a capacitive sensor in one first exemplary embodiment.

FIG. 6 shows one machine part 40 including a capacitive sensor in one first exemplary embodiment. In this first exemplary embodiment of machine part 40 including a capacitive sensor, sensor segments 32 or sensor elements according to the preceding exemplary embodiments are mechanically connected, with the aid of a carrier 42, to a capacitive sensor in such a way that sensor segments 32 or the sensor elements are located on the outside with respect to carrier 42 and completely surround machine part 40. Sensor segments 32 or the sensor elements are mechanically fixedly connected to the carrier, in particular by bonding and/or screwing and/or clamping. Individual carriers 42 are connected to one another via connectors 44, in particular corner connectors. Carriers 42 are preferably made up of a solid material, so that carriers 42 are designed to be flexurally rigid and/or torsionally rigid. Carriers 42 are mechanically connected to machine part 40 via a form-locked and/or force-fit connection. Alternatively or additionally, the carriers are fixedly connected to machine part 40 with the aid of connection techniques, in particular via screwing and/or clamping and/or bonding and/or welding. In this first exemplary embodiment, sensor segments 32 or the sensor elements are provided with a protective element 46 toward the outside. Protective element 46 is made up of a material which is non-conductive and/or has a low dielectric constant and/or a small thickness and/or a constant dielectric constant under changing environmental conditions, in particular temperature and moisture, and during aging of the material. Protective element 46 is preferably made up of foamed plastic, in particular polyurethane (PU) and/or polyethylene (PE) and/or polypropylene (PP), preferably having a thickness of 2 mm to 10 mm, preferably 4 mm.

Figure 7:
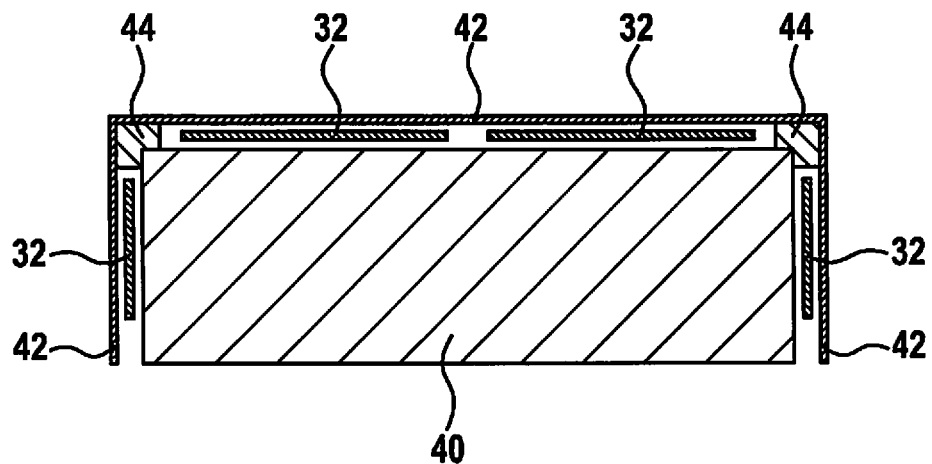
FIG. 7 shows one machine part including a capacitive sensor in one second exemplary embodiment.

FIG. 7 shows one machine part 40 including a capacitive sensor in one second exemplary embodiment. In this second exemplary embodiment of machine part 40 including a capacitive sensor, sensor segments 32 or sensor elements according to the preceding exemplary embodiments are mechanically connected, with the aid of a carrier 42, to a capacitive sensor in such a way that sensor segments 32 or the sensor elements are located on the inside with respect to carrier 42 and completely surround machine part 40. Sensor segments 32 or the sensor elements are mechanically fixedly connected to the carrier, in particular by bonding and/or screwing and/or clamping. Individual carriers 42 are connected to one another via connectors 44, in particular corner connectors. Carriers 42 are mechanically connected to machine part 40 via a form-locked and/or force-fit connection. Alternatively or additionally, the carriers are fixedly connected to machine part 40 with the aid of connection techniques, in particular via screwing and/or clamping and/or bonding and/or welding. Alternatively or additionally, carriers 42 are connected to connectors 44, connectors 44 being mechanically connected to machine part 40 via a form-locked and/or force-fit connection. In this second exemplary embodiment, carrier 42 is made up of a material which is non-conductive and/or has a low dielectric constant and/or a small thickness and/or a steady dielectric constant under changing environmental conditions, in particular temperature and moisture, and during aging of the material. Carriers 42 are preferably made up of a solid material, so that carriers 42 are designed to be flexurally rigid and/or torsionally rigid. Particularly preferably, carriers 42 are made up of polycarbonate or polypropylene, preferably having a thickness between 1 mm and 10 mm, preferably 2 mm, particularly preferably 3 mm.

Preferably, carriers 42 and/or sensor segments 32 and/or the sensor elements in the preceding exemplary embodiments are flat. Alternatively, carriers 42 and/or sensor segments 32 and/or the sensor elements in the preceding exemplary embodiments form surfaces having any shape.

The flexural rigidity and/or torsional rigidity of the capacitive sensor are/is achieved with the aid of a flexurally rigid and/or torsionally rigid carrier and/or with the aid of a flexurally rigid and/or torsionally rigid circuit carrier and/or with the aid of a flexurally rigid and/or torsionally rigid spacer element and/or a combination of these elements.

Figure 8:
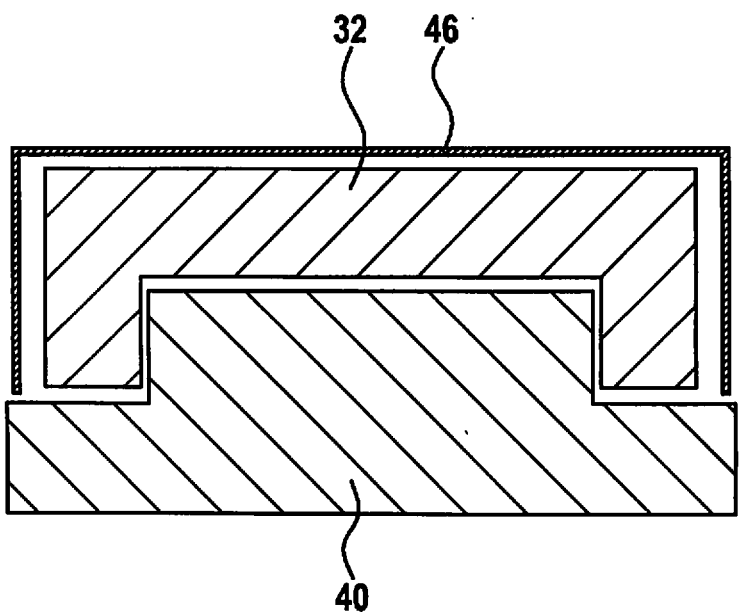
FIG. 8 shows one machine part including a capacitive sensor in one third exemplary embodiment.

FIG. 8 shows a machine part 40 including a capacitive sensor in a third exemplary embodiment, sensor segment 32 being designed according to FIG. 3, in particular being encapsulated using an encapsulation material. Sensor segments 32 or sensor elements are mechanically connected to machine part 40 via a form-locked and/or force-fit connection. Alternatively or additionally, sensor segments 32 or sensor elements are fixedly connected to machine part 40 with the aid of connection techniques, in particular via screwing and/or clamping and/or bonding and/or welding. In this third exemplary embodiment of machine part 40 including a capacitive sensor, sensor segments 32 or the sensor elements are provided with a protective element 46 toward the outside. Protective element 46 is made up of a material which is non-conductive and/or has a low dielectric constant and/or a small thickness and/or a steady dielectric constant under changing environmental conditions, in particular temperature and moisture, and during aging of the material.

The electrically conductive surfaces designed as electrodes are preferably quadrangular. Alternatively or additionally, the electrically conductive surfaces are designed as triangles. In one further variant, the electrically conductive surfaces are round and/or polygonal. Preferably, the sensor elements have a 2-channel design and include at least three, preferably four, electrically conductive surfaces, which are situated and interconnected in such a way that the electrical field lines of the at least two capacitors formed by the interconnection of the electrically conductive surfaces cover a shared spatial area.

Figure 9:
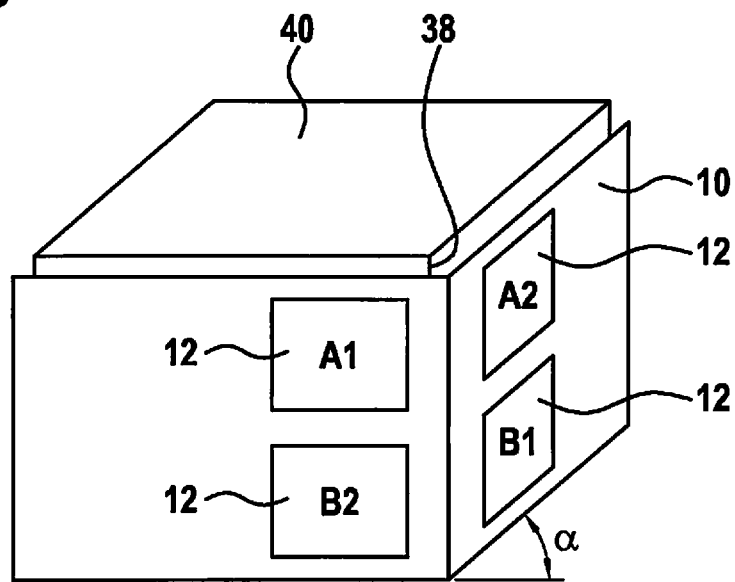
FIG. 9 shows one machine part including a capacitive sensor in one fourth exemplary embodiment.

FIG. 9 shows one machine part 40 including a capacitive sensor in one fourth exemplary embodiment. In this fourth exemplary embodiment, electrically conductive surfaces 12 (electrodes) labeled with A1, B1, A2 and B2 are not situated in one plane, but rather two electrodes are situated on a first plane and the two further electrodes are situated on a second plane which is slanted with respect to the first plane, preferably at an angle $\alpha$ between 0° and 135°, in particular between 45° and 90°. Electrodes A1/B1 and A2/B2 preferably form a capacitor, so that the spatial area of edge 38 of machine part 40 is monitored on two channels for an approach by an object. In one further variant, electrically conductive surfaces 12 are curved surfaces and/or electrically conductive surfaces 12 are mounted on curved surfaces of machine part 40.

Figure 10:
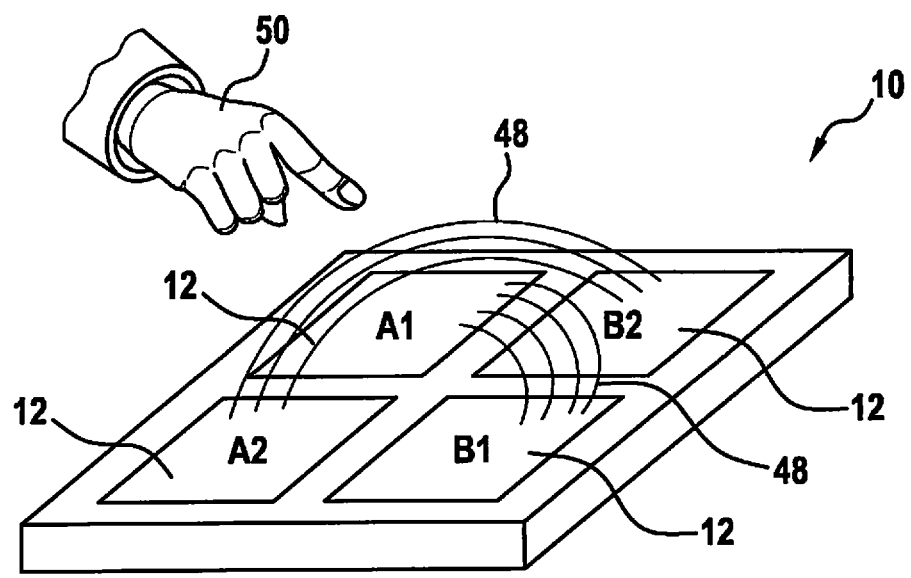
FIG. 10 shows a sensor element and an object.

FIG. 10 shows a sensor element 10 and an object 50. Sensor element 10 includes four electrically conductive surfaces 12 labeled with A1, A2, B1 and B2. In this case, electrically conductive surfaces 12 labeled with A1 and B1 form a first capacitor. After application of a voltage between those electrically conductive surfaces 12 labeled with A1 and B1, an electrical field including field lines 48 forms between these electrically conductive surfaces 12. Correspondingly, electrically conductive surfaces 12 labeled with A2 and B2 form a second capacitor. After application of a voltage between those electrically conductive surfaces 12 labeled with A2 and B2, an electrical field including field lines 48 likewise forms between these electrically conductive surfaces 12. In this case, it is preferably provided that the electrical field of the two capacitors is formed in a temporally alternating manner. In one variant, it is provided that the electrical field of the two capacitors is formed at the same point in time. When an object 50 is approaching, the capacitance between the two electrically conductive surfaces 12 changes, so that the approach by object 50 is detected. In this case, it is not necessary for object 50 to touch sensor element 10, but rather the change in capacitance depending on the size of electrically conductive surfaces 12 already occurs when object 50 is approaching the electrically conductive surfaces. In this case, the detection area of the sensor is approximately as large as the distance between the two electrodes. The detection area is preferably between 1 mm and 300 mm.

Presented in the following is a description, which is based on the use of the capacitive sensor in a robot, by way of example, of how a sensor element detects that an object is approaching, in particular a human body part, on the basis of the change in the value of the capacitance of a capacitor, the capacitor being formed by the two electrically conductive surfaces and the open field space, as a dielectric. During an initialization of the sensor element, the capacitances to be monitored are measured and are stored one time as start values $C_{ij0}$. During operation, the capacitances $C_{ij}$ to be monitored are measured cyclically in a constant time period, typically 100 Hz-1000 Hz. The information regarding an approach may be derived from an evaluation of these data.

Two preferred methods are described in the following, which supplement one another and, therefore, the two may be used simultaneously. An approach is reported when at least one of the methods detects an approach.

a) static approach detection

An approach is detected when the following applies for at least one capacitance $C_{ij}$ $|(C_{ij}-C_{ij0})/C_{ij0}|>T_{stat}$ ; $C_{ij}$: instantaneous measured capacitance value ; $C_{ij0}$: measured value stored during initialization ; $T_{stat}$: applicable threshold value, unit: %.

This means, when at least one measured capacitance value $C_{ij}$ deviates from its initialization value by more than $T_{stat}$, an approach is detected, wherein a typical value range for $T_{stat}$ is 10%-50%.

b) dynamic approach detection

An approach is detected when the following applies for at least one capacitance $C_{ij}$ $d(C_{ij}/C_{ij0})/dt > T_{dyn}$ ; dt: observation period ; $T_{dyn}$: applicable threshold value, unit: %/s This means, when at least one measured capacitance value $C_{ij}$ changes by more than $(T_{dyn}*dt)$ in any time period dt, an approach is detected, wherein a typical value range for dt is 0.1 s-1 s and a typical value range for $T_{dyn}$ is 10%/s-100%/s. The values for $T_{dyn}$ and $T_{stat}$ are established during the system application.

Typically, uniform data may be used for a multitude of sensor elements, whereby an individual specification of the limiting values for individual sensor elements may also be provided in special cases.

Since the change in capacitance increases disproportionately during an approach, the dynamic approach detection effectuates a large operating distance at high speeds and a small operating distance at low speeds. This supports the physical laws that longer braking distances are required at high speeds. Therefore, a collision-free operation of the robot is supported by the dynamic function.

At the same time, an accidental deployment at low speeds is avoided, since a slow change in capacitance does not result in the threshold value $T_{dyn}$ being exceeded. In this way, for example, a machine part, which is operating slowly, as intended, in the proximity of the capacitive sensor does not result in an accidental deployment.

The static approach detection also prevents a pinching of body parts at low speeds, since a reliable machine stoppage always takes place when the minimum distance established by $T_{stat}$ is fallen below.

At a certain rate of change of the capacitance and/or if the capacitance falls below or exceeds the above-described limiting values, it is inferred that there is an approach between the sensor element and an object, for example, a person, which has the potential for collision.

Circuit parts of the evaluation units of the sensor elements convert the measured values of the capacitances into electrical signals and transmit these to a central control unit which is not shown in the figures. The evaluation units preferably carry out a cyclical self-diagnosis for checking all safety-relevant functions of the sensor element.

All the evaluation units of the sensor elements are connected to the central control unit via electrical lines for energy and data transmission.

A large number of sensor elements or sensor segments adjoining one another in a row preferably form a planar capacitive sensor which covers the entire outer surface of a machine part, in particular a robot, particularly preferably a robotic arm as the machine part, in such a way that the spatial surroundings of the machine part may be monitored with respect to the approach by an object.

The described capacitive sensor or the sensor segments or the sensor elements may be utilized in various areas of application, for example, in robots, in particular industrial robots or service robots, and mobile platforms, vehicles, in particular unmanned vehicles, in medical technology and/or in the entertainment industry.

What is claimed is:

1. A capacitive sensor for detecting at a surface that an object is approaching, the capacitive sensor being designed to be at least one of flexurally rigid and torsionally rigid, the capacitive sensor comprising:
   a circuit carrier having a planar surface;
   at least two electrically conductive surfaces which are laterally spaced apart and adjoin one another, the electrically conductive surfaces being co-planar with each other and laterally spaced apart from each other and disposed on the planar surface of the circuit carrier, wherein the conductive surfaces are insulated with respect to one another and form an electrical capacitor in such a way that an electric field corresponding to a capacitance of the electrical capacitor is formed across the co-planar conductive surfaces and that a value of the capacitance changes when an object is approaching;
   a further circuit carrier having a further planar surface, the further circuit carrier being disposed with respect to the circuit carrier at an angle between 45° and 90° with respect to one another; and
   at least two further electrically conductive surfaces which are laterally spaced apart and adjoin one another, the further electrically conductive surfaces being laterally spaced apart from each other and disposed on the further planar surface of the circuit carrier of the further circuit carrier so that the electrically conductive surfaces and the further electrically conductive surfaces are at an angle between 45° and 90° with respect to one another.

2. The capacitive sensor as recited in claim 1, wherein the circuit carrier is at least one of flexurally rigid and torsionally rigid.

3. The capacitive sensor as recited in claim 2, wherein the circuit carrier is a circuit board including strip conductors, the circuit carrier contacting the electrically conductive surfaces with electrical components.

4. The capacitive sensor as recited in claim 3, wherein the capacitive sensor includes a spacer element, the spacer element being designed to be at least one of flexurally rigid and torsionally rigid.

5. The capacitive sensor as recited in claim 4, wherein the spacer element is situated between the electrically conductive surfaces and the circuit carrier.

6. A capacitive sensor for detecting at a surface that an object is approaching, the capacitive sensor being designed to be at least one of flexurally rigid and torsionally rigid, the capacitive sensor comprising:
   a circuit carrier having a planar surface;
   at least two electrically conductive surfaces which are laterally spaced apart and adjoin one another, the electrically conductive surfaces being co-planar with each other and laterally spaced apart from each other and disposed on the planar surface of the circuit carrier, wherein the conductive surfaces are insulated with respect to one another and form an electrical capacitor in such a way that an electric field corresponding to a capacitance of the electrical capacitor is formed across the co-planar conductive surfaces and that a value of the capacitance changes when an object is approaching, wherein:
   the circuit carrier is at least one of flexurally rigid and torsionally rigid,
   the circuit carrier is a circuit board including strip conductors, the circuit carrier contacting the electrically conductive surfaces with electrical components,
   the capacitive sensor includes a spacer element, the spacer element being designed to be at least one of flexurally rigid and torsionally rigid, the spacer element is situated between the electrically conductive surfaces and the circuit carrier the electrically conductive surfaces make contact with the circuit carrier via electrically conductive connections through the spacer element.

7. The capacitive sensor as recited in claim 1, wherein the capacitive sensor includes a carrier, the carrier being at least one of flexurally rigid and torsionally rigid.

8. The capacitive sensor as recited in claim 7, wherein the carrier is designed in such a way that the capacitive sensor is connectable to a machine part via the carrier.

9. The capacitive sensor as recited in claim 2, wherein the capacitive sensor includes one further circuit carrier, the further circuit carrier being a circuit board or foil, and the electrically conductive surfaces are situated on the further circuit carrier.

10. The capacitive sensor as recited in claim 2, wherein the capacitive sensor is at least one of flexurally rigid and torsionally rigid only after at least one of: i) encapsulating the capacitive sensor, ii) filling the capacitive sensor with foam, and iii) embedding the capacitive sensor in a gel.

11. A capacitive sensor for detecting at a surface that an object is approaching, the capacitive sensor being designed to be at least one of flexurally rigid and torsionally rigid, the capacitive sensor comprising:
a circuit carrier having a planar surface;
at least two electrically conductive surfaces which are laterally spaced apart and adjoin one another, the electrically conductive surfaces being co-planar with each other and laterally spaced apart from each other and disposed on the planar surface of the circuit carrier, wherein the conductive surfaces are insulated with respect to one another and form an electrical capacitor in such a way that an electric field corresponding to a capacitance of the electrical capacitor is formed across the co-planar conductive surfaces and that a value of the capacitance changes when an object is approaching, wherein the capacitive sensor is made up of a composite of at least two different layers, each layer being itself flexible and the capacitive sensor is at least one of flexurally rigid and torsionally rigid only due to the composite of the two different layers, at least one of the two different layers including at least one of a circuit carrier, a spacer element, a carrier, and a further circuit carrier.

12. The capacitive sensor as recited in claim 1, wherein at least two of the electrically conductive surfaces are slanted with respect to one another at an angle between 0° and 135°.

13. The capacitive sensor as recited in claim 12, wherein the angle is between 45° and 90°.

14. The capacitive sensor as recited in claim 1, wherein the capacitive sensor includes at least three electrically conductive surfaces which are interconnected in such a way that the electrically conductive surfaces form at least two electrical capacitors, the electrically conductive surfaces being situated in such a way that detection areas, which are formed by electrical field lines, of the two electrical capacitors at least partially overlap.

15. The capacitive sensor as recited in claim 14, wherein the at least three electrically conductive surfaces include four electrically conductive surfaces.

16. A machine part including multiple capacitive sensors, the capacitive sensors being at least one of flexurally rigid and torsionally rigid, the capacitive sensors including at least two electrically conductive surfaces which are laterally spaced apart and adjoin one another, the conductive surfaces being insulated with respect to one another and form an electrical capacitor in such a way that a value of a capacitance of the electrical capacitor changes when an object is approaching, wherein the capacitive sensors cover the entire outer surface of the machine part in such a way that spatial surroundings of the machine part are monitored for the approach by an object, each of the capacitive sensor comprising:
a circuit carrier having a planar surface, wherein the electrically conductive surfaces are co-planar with each other and laterally spaced apart from each other and disposed on the planar surface of the circuit carrier, wherein the conductive surfaces are insulated with respect to one another and form the electrical capacitor in such a way that an electric field corresponding to the capacitance of the electrical capacitor is formed across the co-planar conductive surfaces and that a value of the capacitance changes when the object is approaching, wherein at least one of the capacitive sensors further includes:
a further circuit carrier having a further planar surface, the further circuit carrier being disposed with respect to the circuit carrier of the at least one capacitive sensor at an angle between 45° and 90° with respect to one another; and
at least two further electrically conductive surfaces which are laterally spaced apart and adjoin one another, the further electrically conductive surfaces being laterally spaced apart from each other and disposed on the further planar surface of the further circuit carrier so that the electrically conductive surfaces and the further electrically conductive surfaces are at an angle between 45° and 90° with respect to one another.

17. The machine part as recite in claim 16, wherein the machine part is an industrial robot.

* * * * *